United States Patent [19]
Levy

[11] Patent Number: 5,402,079
[45] Date of Patent: Mar. 28, 1995

[54] INTEGRATED CIRCUIT RELAY CONTROL SYSTEM

[75] Inventor: Paul S. Levy, Chandler, Ariz.

[73] Assignee: VLSI Technology, Inc., San Jose, Calif.

[21] Appl. No.: 993,175

[22] Filed: Dec. 18, 1992

[51] Int. Cl.$^6$ .............................................. G01R 15/02
[52] U.S. Cl. .................................... 324/765; 324/73.1
[58] Field of Search .............. 324/158 T, 158 R, 73.1, 324/765, 750, 158.1, 768, 769; 371/15.1, 16.1, 25.1; 437/8

[56] References Cited

U.S. PATENT DOCUMENTS

| | | | |
|---|---|---|---|
| 3,660,758 | 5/1972 | Means | 324/158 T |
| 4,117,400 | 9/1978 | Feldman | 324/158 T |
| 4,339,673 | 7/1982 | Perry | 324/158 T |
| 4,929,888 | 5/1990 | Yoshida | 324/158 R |

*Primary Examiner*—Vinh Nguyen
*Attorney, Agent, or Firm*—LaValle D. Ptak

[57] ABSTRACT

A universal performance board for use with integrated circuit testers operates to set the power supply attribute relays or I/O loads on a performance board or load board through an integrated circuit relay control circuit. The control information for the power supply attribute relays or I/O loads is supplied from the tester to the data input of the relay control circuit at the start-up of operation for testing each new integrated circuit under test. The required control information is loaded into the relay control circuit, which then selectively operates the power supply attribute relays or I/O loads. After the relay control information has been loaded into the control circuit, the tester channels are released to be used by the tester in a normal testing function of the integrated circuit device under test. A battery back-up support is provided for memory retention in the relay control circuit; so that the control information is retained until it is subsequently changed by the supply of new control information from the tester whenever the integrated circuit device under test is changed to a different type of device.

14 Claims, 1 Drawing Sheet

INTEGRATED CIRCUIT RELAY CONTROL SYSTEM

BACKGROUND

Integrated circuit devices currently are being manufactured with a large number of pins, which include input/output pins, pins to be connected to one or more supply voltages (VDD), and pins which are to be connected to ground in the operation of the device. Sixty-four pin integrated circuit devices are common; and large scale integrated circuits, including up to five-hundred twelve pins, currently exist.

In the manufacture of integrated circuit devices, and, in many cases, prior to the inclusion of such integrated circuit devices into equipment incorporating these devices, it is desirable to test the operating characteristics of the devices. This typically is done by a multiple channel tester, which is capable of applying required power supply and ground potentials to selected pins of the integrated circuit device under test, and also for supplying signals to and receiving signals from the input/output (I/O) pins of the device under test. The integrated circuit tester equipment typically is interconnected with an integrated circuit device under test (DUT) by means of a load board, which provides the desired interface between the tester and the device to be tested.

Load boards or performance boards for testing integrated circuit devices are relatively complex and expensive. Frequently, load boards are custom designed to provide a specific interface between a particular integrated circuit device which is to be tested and the tester, which is used to operate the device during its test mode of operation. If a tester is always used to test the same integrated circuit devices, a dedicated load board for interfacing between the tester and the integrated circuit device is practical. If a different integrated circuit device, however, having the same number of pins, but arranged in a different order, or devices having different numbers of pins are to be tested, it has been necessary to have a different specific dedicated load board for each different integrated circuit device. This is quite expensive.

Universal load boards have been designed which are capable of interfacing different integrated circuit devices undergoing test with a tester system. When a universal load board is used, the board must have the capacity to set any of the interface channels to match any of the channels of the tester to any one of the pins on the integrated circuit device undergoing test to operate either as an input/output pin, or to be connected to ground or to a source of power (VDD). This is accomplished by providing separate power supply attribute relays on the universal load board or performance board for each of the channels. Manually set toggle switches then have been used as memory devices for activating selected ones of the relays, in accordance with the desired interconnections which are to be effected between the tester to the integrated circuit device under test. The time required for setting each of these toggle switches is considerable. It also is necessary carefully to check the switch settings prior to operation of the tester to ensure that no errors exist, which then would invalidate the subsequent tests to be run. Substantial potential for error exists in such a system.

Consequently, it is desirable to provide an improved system for setting the power supply attribute relays of a universal performance board used in conjunction with an integrated circuit tester.

SUMMARY OF THE INVENTION

It is an object of this invention to provide an improved system for integrated circuit test systems.

It is another object of this invention to provide an improved system for setting the power supply attribute relays of a universal performance board for an integrated circuit tester.

It is an additional object of this invention to provide a programmable relay control circuit for the interface board of an integrated circuit test system.

It is a further object of this invention to provide an improved programmable integrated relay control circuit for use to set the power supply attribute relays of an integrated circuit test system.

In accordance with a preferred embodiment of this invention, a switch control system is provided for the power selection for the terminals of a multiple pin integrated circuit device undergoing testing. A programmable relay control circuit has a plurality of output channels. Power supply attribute relays are connected to each of the output channels for operation in response to operating signals supplied to the output channel by the relay control circuit. Control information is supplied from an integrated circuit tester system to set up the relay control circuit to supply the operating signals to selected output channels corresponding to the control information obtained from the tester. The control information is stored in the relay control circuit until such time as it is changed by new control information supplied from the tester. In this manner, the relays are selectively operated automatically, without requiring any manual switch selection.

DETAILED DESCRIPTION

Figure 1:
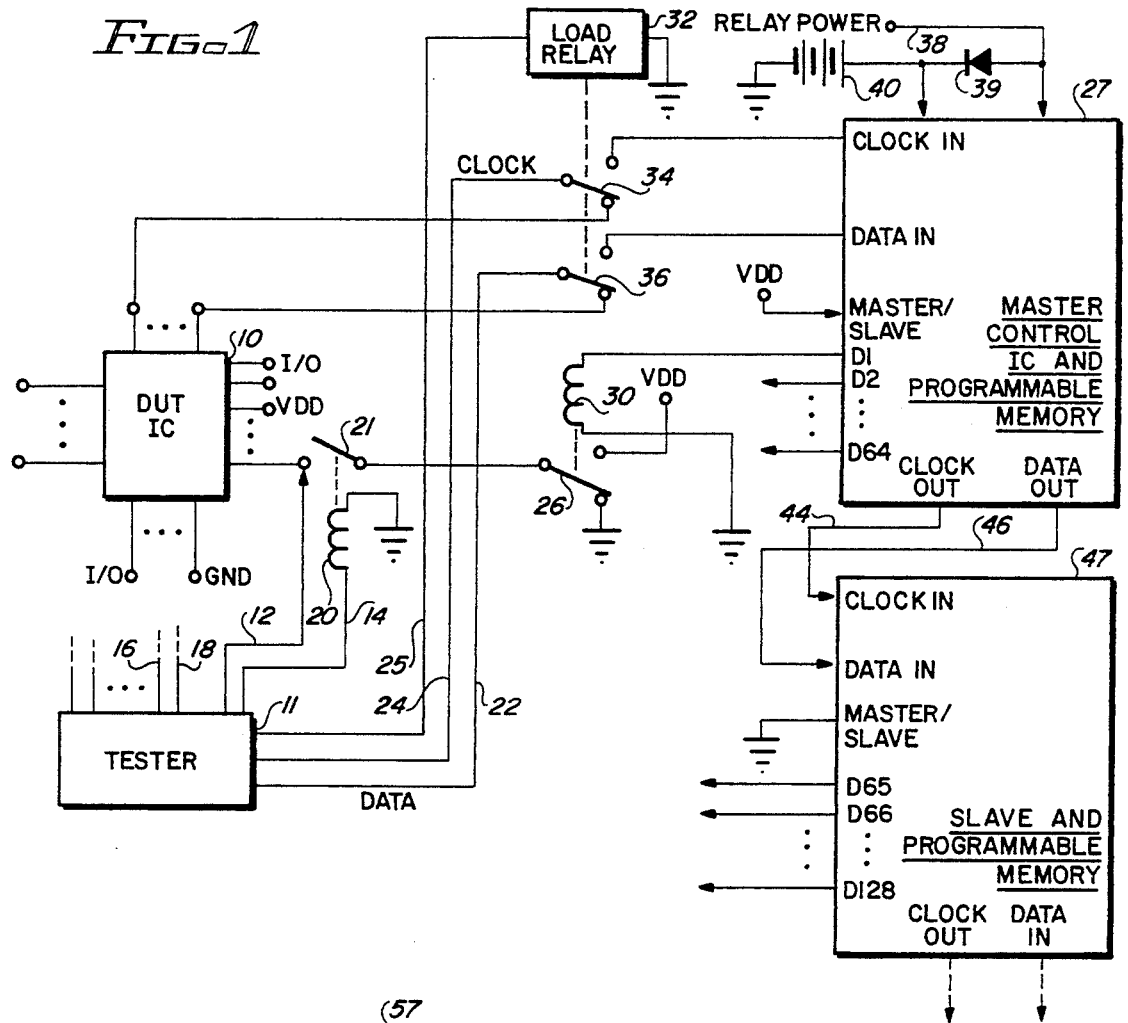
FIG. 1 is a detailed circuit diagram of a preferred embodiment of the invention.

Reference now should be made to the drawing, in which the same reference numbers are used in both figures to designate the same components. FIG. 1 is a block circuit diagram of an improved integrated circuit relay control system for use in conjunction with a universal performance board interface between an integrated circuit device under test (DUT) 10 and a tester system 11. The integrated circuit device 10 includes a large number of pins, which are specifically designated by the manufacturer for attachment to input/output (I/O) leads, operating power supply VDD or ground (GND). A small number of such leads are indicated as extending from the four sides of the integrated circuit package 10 in FIG. 1; and some of these are labeled with various ones of these designations, namely I/O, VDD, and GND.

When such a device is to be tested, different output leads from the tester 11 are connected through the performance board or load board to the various pins of the device under test (DUT) 10. In order to avoid cluttering the drawing, only one of these connections to only a single pin of the DUT 10 is illustrated in FIG. 1. For each of the leads, such as the lead 12 from the tester 11, a companion lead 14 also is provided to supply power through the operating coil 20 of a tester utility relay, the other end of which is connected to ground. Whenever power is applied over the lead 14 through the coil 20, a normally open relay contact 21 is closed. It is apparent that the contact 21 is connected to the same electrical connection point on the lowermost right-hand pin of the DUT 10, as is the lead 12. When the contact 21 is open, as illustrated in FIG. 1, all of the signals on the lower right-hand pin of the DUT 10 are supplied to or from the tester 11 over the lead 12. Similar pairs of tester leads (such as 16 and 18), for connection to each of the different pins on the DUT 10 and an associated utility relay similar to the utility relay 20, are provided for all of the pins of the DUT 10.

The tester 11 effects the interface connections to the DUT 10 through a universal load board or a universal performance board, which actually effects the electrical interconnections. Whenever a pin of the DUT 10 is an input/output (I/O) pin, the corresponding utility relay contact for that pin, such as the contact 21 shown in FIG. 1, is open; so that input/output (I/O) signals required for the test are passed between the tester 11 and the IC DUT 10 (via the lead 12, for example).

For those pins of the DUT 10 which must be connected either to ground or to operating potential (VDD), the corresponding relay switch, such as the switch 21, is closed by applying operating potential to its operating coil, such as the coil 20 shown in FIG. 1. This then permits either ground potential or VDD potential to be applied through the now-closed switch contact 21 to the pin in accordance with the operating position of another relay contact 26, illustrated in FIG. 1 as normally connected to ground potential. If VDD potential is to be applied to the corresponding pin of the DUT 10, a corresponding relay coil, such as the relay coil 30, is operated to pull the contact 26 from its lower position to its upper position, where it then is attached to a source of operating potential (VDD) as illustrated in FIG. 1. Operation of the relay 30 (and corresponding relays for each one of the pins of the DUT 10) is effected by means of a control IC, shown as a cascaded connection of a master control IC 27 and one or more additional or slave control ICs 47 in FIG. 1.

Prior to the operation of the tester 11, for each type of integrated circuit DUT 10, data corresponding to the pin arrangement of the DUT 10 which is to undergo test is provided to the tester 11. This information may be stored in a memory bank in the tester 11, or it may be entered by means of hardware or software, as desired, for the particular integrated circuit device 10 which is to be tested. In any event, prior to the testing of the first of a series of similar DUT devices 10, the pattern for the application of operating potential and ground to various ones of the pins of the DUT 10 must be ascertained, with these potentials then being applied to those pins. The remaining I/O pins are connected for operation through leads, such as the leads 12 and 16 shown in FIG. 1, at the junction point of open switches, such as the open switch 21.

When a test operation is to begin, a signal is applied over a lead 25 from the tester 11 to a load relay 32. The relay 32 then pulls a pair of contacts 34 and 36 from their normal lower position, illustrated in FIG. 1, to an upper position. In the upper position, data signals are applied from the tester 11 over a lead 22 through the contact 36 to a data input terminal of the master control IC 27. Similarly, clock signals are obtained from the tester 11, and are applied over a lead 24 through the contact 34 to a clock input for the master control IC 27.

The operation of the load relay 32 is for a very short period of time, essentially momentary. The data concerning the pin mapping for the DUT 10, which is to undergo test, is supplied rapidly over the lead 22 and is stored in programmable memory in the master control IC. Each of the control ICs, such as the IC 27 and the slave IC 47, have sixty-four output channels. As many of these control ICs may be cascaded together as are necessary to provide the desired number of output channels for testing any given integrated circuit device. Currently, integrated circuit devices having as many as 384 pins or 512 pins, are available; so that an appropriate number of additional or slave control ICs 47 need to be cascaded together to obtain the desired number of outputs. The data supplied over the lead 22 to the master control IC through the switch 36 then is cascaded through an interconnecting lead 46 to the slave control IC 47. Similarly, the clock signals are cascaded from the master control ICs 27 through an output clock lead 44 to the slave control IC 47; and from one slave control IC to the next. The manner in which this is done is standard; and the control ICs essentially comprise programmable memories for providing selective outputs on the sixty-four output channels corresponding to the setting of the different stages of memory in each of the ICs 27 and 47.

Operating relay power for the master control IC 27, and all of the slave IC's 47 which are cascaded to the master control IC 27, is supplied over a lead 38, which is isolated from a back-up battery 40 by means of a diode 39. If the battery 40 is a rechargeable battery, the diode 39 is used to apply charging current to the battery 40 at all times when the .relay power is available on the lead 38.

As illustrated in FIG. 1, for those pins of the DUT 10 which are to be connected to operating potential (VDD), an operating current is supplied through the operating coil of a corresponding relay to cause that relay to move its contact from a connection to ground to a connection to VDD. This is illustrated for a single one of the channels in FIG. 1, namely channel D-1 from the master control IC 27. When operating current is applied through the relay coil 30 from the channel D1 of the master control IC 27, the current through the coil 30 causes the contact 26 to be moved from its ground connection to the VDD connection. Each of the sixty-four output channels from each of the master and slave control ICs 27 and 47 are connected to a different relay coil, similar to the coil 30 shown in FIG. 1. The replication of all of these different circuit interconnections is not made in FIG. 1 in order to avoid unnecessary cluttering of the drawing.

Once the mapping information or control information for selectively operating the power supply relays, such as the relay 30, has been stored in the memories of the ICs 27 and 47, the operating potential on the lead 25 for the load relay 32 is removed. When this occurs, the contacts 34 and 36 return to the normal position shown in FIG. 1; so that the clock and data information supplied from the tester 11 then is connected to appropriate inputs to the DUT 10 to permit the testing operation to be effected.

Whenever any one of the pins of the DUT 10 is not intended to function as an I/O pin, the utility relay, such as the relay 20, corresponding to that pin, is operated to close the corresponding contact 21. This then causes either ground potential or VDD potential to be applied to that pin in accordance with the operation or nonoperation of the relay coil 30 associated with the corresponding contact 26 illustrated in FIG. 1. The relay operating power 38 supplied to the control IC units 27 and 44 is sufficient to maintain operated all of the power supply attribute relays which are to be operated in accordance with the information stored in the memories of the ICs 27 and 47.

During times when no tests are being effected, the relay power on the lead 38 may be removed. At such time as this occurs, back-up power from the battery 40 is sufficient to maintain the operating state of the information stored in the memories of the control ICs 27 and 47; so that these devices do not need to be reset, so long as the next DUT 10 under test is the same type of DUT as the previous one.

Whenever a different DUT 10, having a different number of pins or a different pin number designation is to be tested, the foregoing procedure is repeated. Consequently, a very rapid and accurate setting of the power supply attribute relays 30/26 may be effected in place of the tedious and error-prone manual toggle switch approach, which previously was employed.

Figure 2:
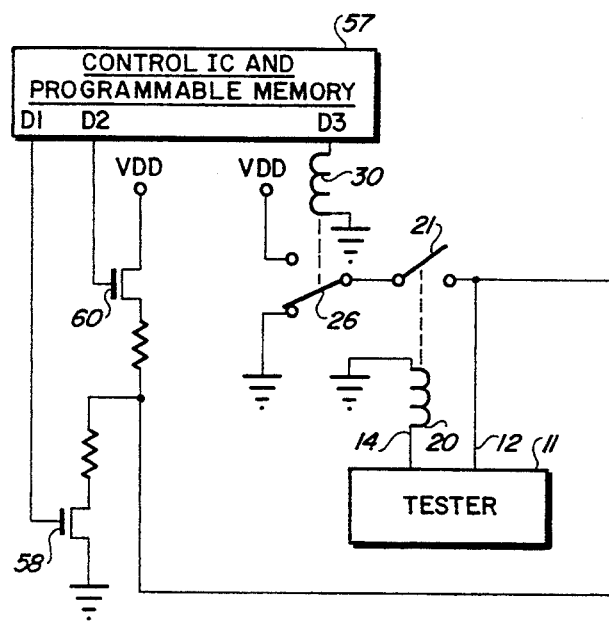
FIG. 2 is an alternate embodiment of the invention shown in FIG. 1.
Figure 2:
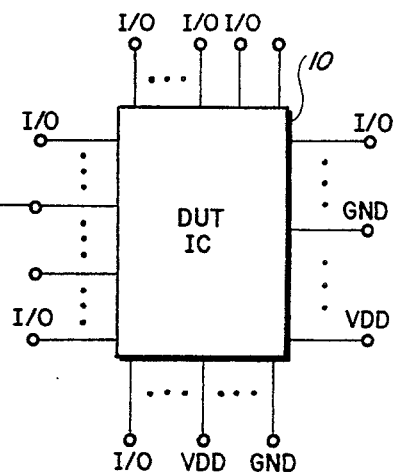

FIG. 2 illustrates a variation of a portion of the circuit of FIG. 1 for modifying the interconnections which may be made to each of the different pins of the DUT 10. In place of a single output lead for each channel (such as D1 in FIG. 1), the master control IC and slave control ICs may provide three different leads for each channel, as indicated in a portion of a control IC 57 in FIG. 2. Each of the three lead sets (D1, D2, and D3) shown extending from control IC 57 in FIG. 2, are used in place of each of the single channels of the devices 27 and 47 shown in FIG. 1.

Only one of these channel sets is illustrated in FIG. 2; but it should be noted that a set comparable to the one shown in FIG. 2 is provided for each of the tester output leads and/or pins of the device under test 10. The interconnections of the tester 11 with the device 10, by means of the leads 12 and the utility relay 20/21, are the same as described above in conjunction with FIG. 1. The voltage which is applied through the closed contact 21 (whenever that contact is closed for a given pin of the DUT 10) also is obtained from a two-position relay such as the relay 26/30 of FIG. 1.

In addition to the operating current for the relay coil 30 (comparable to the same relay coil of FIG. 1) the circuit of FIG. 2 includes two additional outputs for connecting an open source load and an open drain load, respectively, to the selected pin of the DUT 10. This is accomplished by a pair of FET transistors 58 and 60. The transistor 58 has its drain connected to ground, and the source connected through a resistor to the corresponding pin of the DUT 10. Similarly, the transistor 60 has its source connected to VDD and its drain connected through a resistor to the same lead connected to the corresponding pin of the DUT 10. The gates of the transistors 58 and 60 are connected, respectively, to outputs D1 and D2 of the control IC 57.

In the operation of FIG. 2, the data which is supplied over the lead 22 (of FIG. 1) to the control IC 57 is supplied in the same manner described above in conjunction with FIG. 1. That data is stored in memory to cause an output operating signal to be applied to any one of the outputs D1, D2, D3, (or none of them) of the control IC 57 in accordance with the potential which is to be applied to the pin of the DUT IC 10.

In FIG. 2, the set which is illustrated is shown connected to a pin of the DUT IC 10, which may be configured with any one of a variety of different connections. This pin may be either an I/O pin; or it may be connected to VDD or VSS (ground) by means of the operation of the relays 20/21 and 30/26 (in the same manner described above in conjunction with the circuit of FIG. 1). In addition, however, when the relay 20 is not operated, causing the contact 20 to be open, as illustrated in FIG. 2, operating potential supplied from either of the outputs D1 or D2 of the control IC 57 causes the selected FET transistor 58 or 60 to be rendered conductive. When the transistor 58 is rendered conductive, an open source load is connected to the corresponding pin of the DUT IC 10. Then the FET transistor 60 is rendered conductive, an open drain load is connected to the corresponding DUT IC 10.

A corresponding circuit set is associated with each and every one of the input pins of the DUT IC 10. The information necessary to effect the conductivity of the various transistor sets, such as the transistors 58 and 60, plus the information for either operating or not operating the relay 20/21, is established by information generated from the test program and transferred by the tester 11.

As described above in conjunction with FIG. 1, the loading of all of the necessary relay operation information may be effected in a very short period of time, through a momentary operation of the load relay 32 at the beginning of the test cycle. Once the information has been loaded, no further loading needs to be effected, so long as the DUT 10 which is being tested is always of the same type. Whenever a different type of DUT 10 is to be tested, the initialization operation, described above in conjunction with FIG. 1, is effected, whether the circuit of FIG. 1 is employed or the more sophisticated circuit of FIG. 2 is used.

The system which has been described substantially reduces the time required to effect testing of integrated circuit devices through universal load boards. By utilizing a universal load board, the necessity for designing and building different load boards for each different type of integrated circuit, which may be tested by a tester 11, is eliminated. At the same time, the set up for a change-over of the universal board operation of the power supply attribute relays (whether they are inductive or electronic) is fully automated.

The foregoing description of the preferred embodiments of the invention should be considered as illustrative and not as limiting. Various changes and modifications will occur to those skilled in the art, without departing from the true scope of the invention as defined in the appended claims.

I claim:

1. A relay switch control system for effecting power selection for the terminals of a multiple pin integrated circuit device undergoing testing by a multiple channel tester including in combination:

a relay control circuit having a plurality of output channels;

a relay connected to each of the output channels of said relay control circuit for operation in response to operating signals supplied to each of said output channels by said relay control circuit;

said tester coupled with said relay control circuit for supplying control information from said tester to said relay control circuit to cause said relay control circuit to supply operating signals to selected ones of said plurality of output channels thereof corresponding to said control information;

a plurality of potential supply leads corresponding to each of said plurality of output channels of said relay control circuit;

means coupled with each of said relays for supplying predetermined potentials to said potential supply leads in accordance with operating signals supplied to said selected output channels of said relay control circuit; and a switch connected between each of said potential supply leads and corresponding pins of said multiple pin integrated circuit device undergoing testing.

2. The combination according to claim 1 wherein said relay control circuit comprises a programmable relay control circuit.

3. The combination according to claim 2 wherein said programmable relay control circuit is an integrated circuit having a programmable memory therein, and said control information from said tester is stored in said programmable memory to cause said relay control circuit to supply said operating signals to said selected ones of said output channels.

4. The combination according to claim 3 wherein said switch is controlled by said tester and comprises a plurality of switches, each connected in series electrical circuit between a different one of said potential supply leads and a different one of the pins of said multiple pin integrated circuit undergoing testing, with said switches controlled by said tester.

5. The combination according to claim 4 wherein said switches are selectively operated by said tester for interconnecting said potential supply leads to selected ones of the pins of said multiple pin integrated circuit device.

6. The combination according to claim 5 wherein said tester operates momentarily at the beginning of the testing of each different type of integrated circuit device undergoing testing to supply said control information to said relay control circuit, with said control information then being stored in said relay control circuit for subsequent operation of said tester for testing multiple pin integrated circuit devices.

7. The combination according to claim 6 further including means coupled with said relay control circuit for retaining said control information in said relay control circuit until new control information is supplied thereto by said tester.

8. The combination according to claim 7 wherein said relays are inductive relays.

9. The combination according to claim 7 wherein said relays are electronic switches.

10. The combination according to claim 1 wherein said tester operates momentarily at the beginning of the testing of each different type of integrated circuit device undergoing testing to supply said control information to said relay control circuit, with said control information then being stored in said relay control circuit for subsequent operation of said tester for testing multiple pin integrated circuit devices.

11. The combination according to claim 1 wherein said switches are selectively operated by said tester for interconnecting said potential supply leads to selected ones of the pins of said multiple pin integrated circuit device.

12. The combination according to claim 1 wherein said switch is controlled by said tester and comprises a plurality of switches, each connected in series electrical circuit between a different one of said potential supply leads and a different one of the pins of said multiple pin integrated circuit undergoing testing, with said switches controlled by said tester.

13. The combination according to claim 1 wherein said relays are inductive relays.

14. The combination according to claim 1 wherein said relays are electronic switches.

* * * * *